United States Patent
Tang et al.

(10) Patent No.: US 10,680,067 B2
(45) Date of Patent: Jun. 9, 2020

(54) SILICON CARBIDE MOSFET DEVICE AND METHOD FOR MANUFACTURING THE SAME

(71) Applicants: INSTITUTE OF MICROELECTRONICS, CHINESE ACADEMY OF SCIENCES, Beijing (CN); ZHUZHOU CRRC TIMES ELECTRIC CO., LTD., Zhuzhou (CN)

(72) Inventors: Yidan Tang, Beijing (CN); Huajun Shen, Beijing (CN); Yun Bai, Beijing (CN); Jingtao Zhou, Beijing (CN); Chengyue Yang, Beijing (CN); Xinyu Liu, Beijing (CN); Chengzhan Li, Zhuzhou (CN); Guoyou Liu, Zhuzhou (CN)

(73) Assignees: INSTITUTE OF MICROELECTRONICS, CHINESE ACADEMY OF SCIENCES, Beijing (CN); ZHUZHOU CRRC TIMES ELECTRIC CO., LTD., Zhuzhou (CN)

( * ) Notice: Subject to any disclaimer, the term of this patent is extended or adjusted under 35 U.S.C. 154(b) by 30 days.

(21) Appl. No.: 15/759,102

(22) PCT Filed: Sep. 10, 2015

(86) PCT No.: PCT/CN2015/089335
§ 371 (c)(1),
(2) Date: Sep. 10, 2018

(87) PCT Pub. No.: WO2017/041268
PCT Pub. Date: Mar. 16, 2017

(65) Prior Publication Data
US 2019/0013383 A1    Jan. 10, 2019

(51) Int. Cl.
*H01L 21/336* (2006.01)
*H01L 29/66* (2006.01)
(Continued)

(52) U.S. Cl.
CPC .... *H01L 29/1608* (2013.01); *H01L 21/02041* (2013.01); *H01L 21/02304* (2013.01);
(Continued)

(58) Field of Classification Search
CPC ............................................... H01L 21/02697
(Continued)

(56) References Cited

U.S. PATENT DOCUMENTS

| | | | | |
|---|---|---|---|---|
| 7,074,643 | B2 * | 7/2006 | Ryu | H01L 21/049 438/105 |
| 8,288,220 | B2 * | 10/2012 | Hull | H01L 29/0847 438/212 |

(Continued)

FOREIGN PATENT DOCUMENTS

| | | |
|---|---|---|
| CN | 102254930 | 11/2011 |
| CN | 102779852 | 11/2012 |

(Continued)

OTHER PUBLICATIONS

International Search Report and Written Opinion, issued in the corresponding PCT Application No. PCT/CN2015/089335, dated May 27, 2016, 17 pages.
(Continued)

*Primary Examiner* — Calvin Lee
(74) *Attorney, Agent, or Firm* — Hamre, Schumann, Mueller & Larson, P.C.

(57) ABSTRACT

The present disclosure discloses a self-aligned silicon carbide MOSFET device with an optimized P$^+$ region and a manufacturing method thereof. The self-aligned silicon carbide MOSFET device is formed by a plurality of silicon
(Continued)

carbide MOSFET device cells connected in parallel, and these silicon carbide MOSFET device cells are arranged evenly. The silicon carbide MOSFET device cell comprises two source electrodes, one gate electrode, one gate oxide layer, two $N^+$ source regions, two $P^+$ contact regions, two P wells, one $N^-$ drift layer, one buffer layer, one $N^+$ substrate, one drain electrode and one isolation dielectric layer. By optimizing the $P^+$ region, the present disclosure forms a good source ohmic contact, reduces the on-resistance, and also shorts the source electrode and the P well to prevent the parasitic transistor effect of the parasitic NPN and PiN, which may take both conduction characteristics and the breakdown characteristics of the device into consideration, and may be applied to a high voltage, high frequency silicon carbide MOSFET device. The self-aligned manufacturing method used in the present disclosure simplifies the process, controls a size of a channel accurately, and may produce a lateral and vertical power MOSFET.

11 Claims, 6 Drawing Sheets

(51) Int. Cl.

| | | |
|---|---|---|
| *H01L 29/16* | (2006.01) |
| *H01L 29/06* | (2006.01) |
| *H01L 29/78* | (2006.01) |
| *H01L 21/02* | (2006.01) |
| *H01L 21/04* | (2006.01) |
| *H01L 21/324* | (2006.01) |
| *H01L 27/092* | (2006.01) |
| *H01L 29/08* | (2006.01) |
| *H01L 29/417* | (2006.01) |
| *H01L 29/423* | (2006.01) |

(52) U.S. Cl.
 CPC ........ *H01L 21/046* (2013.01); *H01L 21/324* (2013.01); *H01L 27/0927* (2013.01); *H01L 29/06* (2013.01); *H01L 29/0649* (2013.01); *H01L 29/086* (2013.01); *H01L 29/41725* (2013.01); *H01L 29/42356* (2013.01); *H01L 29/66068* (2013.01); *H01L 29/66674* (2013.01); *H01L 29/78* (2013.01); *H01L 29/7801* (2013.01)

(58) Field of Classification Search
 USPC .................. 438/140, 279–284; 257/341, 401
 See application file for complete search history.

(56) References Cited

U.S. PATENT DOCUMENTS

| | | | |
|---|---|---|---|
| 8,785,931 B2 * | 7/2014 | Kinouchi | G01K 7/01 257/48 |
| 9,230,807 B2 * | 1/2016 | Stum | H01L 21/0485 |
| 9,515,145 B2 | 12/2016 | Furuhashi et al. | |
| 2010/0078650 A1 | 4/2010 | Hatakeyama et al. | |
| 2011/0284923 A1 | 11/2011 | Kamata | |
| 2013/0026559 A1 | 1/2013 | Arthur et al. | |

FOREIGN PATENT DOCUMENTS

| | | |
|---|---|---|
| CN | 103872101 | 6/2014 |
| CN | 105161539 | 12/2015 |
| WO | 2014/105371 | 7/2014 |
| WO | 2014/132582 | 9/2014 |

OTHER PUBLICATIONS

Office Action, issued in the corresponding Chinese Patent Application No. 201510574417.3, dated Aug. 16, 2017, 13 pages.

* cited by examiner

SILICON CARBIDE MOSFET DEVICE AND METHOD FOR MANUFACTURING THE SAME

TECHNICAL FIELD

The present disclosure relates to a self-aligned silicon carbide MOSFET device and a method for manufacturing the same, and particularly, to a self-aligned silicon carbide MOSFET device with an optimized $P^+$ region and a method for manufacturing the same.

BACKGROUND

Silicon carbide material has excellent physical and electrical characteristics, and has become one kind of ideal semiconductor material for manufacturing a device of high power, high frequency, high voltage, thermostability and anti-radiation owing to its superior physical and chemical properties of wide band gap, high thermal conductivity, high breakdown field, high saturation velocity. high-power, high frequency, high breakdown voltage, high-temperature and radiation resistant device, and has a broad application prospect in military and civil aspects. Silicon carbide MOSFET devices have advantages of a fast switching speed and small on-resistance etc., and may achieve a higher breakdown voltage by a smaller thickness of a drift layer, which reduces a volume of a power switch module and energy consumption, and has obvious advantages in application fields such as a power switch, a converter etc.

During a process for manufacturing a traditional silicon carbide MOSFET device, it is generally required to heavily dope a $P^+$ region to form a good source ohmic contact and to form a short-circuit connection between a source electrode and a P well. Considering a relationship between implantation dose and implantation energy, an implantation depth is generally shallow. A shallow $P^+$ implantation is prone to generate a parasitic transistor effect of NPN and PiN (a parasitic NPN transistor in a blocking state is easy to occur avalanche breakdown, and a parasitic PiN diode is easy to be depleted at a P side, leading to a breakdown phenomenon; the parasitic NPN transistor in a turned on state is easy to be switched on by mistake), especially for a VDMOSFET device. However, if the $P^+$ region is deeply and heavily doped, the implantation depth is close to or beyond a bottom of the P well. For the same ion implantation element, not only a combination of high energy and high dose is required, which greatly increases an implantation time and an implantation cost, but also an activation annealing quality will be affected, and thus performance of the silicon carbide MOSFET device will be affected. By optimizing the $P^+$ region, the silicon carbide MOSFET device provided by the present disclosure may form a good source ohmic contact to decrease an on-resistance and to short the source electrode and the P well to prevent the parasitic transistor effect of the parasitic NPN and PiN, which may take both of turned-on characteristics and the breakdown characteristics of the device into consideration, and may be applied to a high voltage, high frequency silicon carbide MOSFET device.

A self-aligning process may effectively reduce a channel length, and thus reduce channel resistance and improve a switching rate of the device. In a MOSFET manufacturing process, a self-aligned source region implantation is generally implemented by lateral movement in a polysilicon (Poly-Si) thermal oxidation process, so as to form a self-aligned channel, as shown in FIG. 2a. This method has a strict requirement on the Poly-Si thermal oxidation process, and cannot accurately control a size of the formed channel. The self-aligning manufacturing method used in the present disclosure is to form a self-aligned channel by a method of etching a side wall by insulating layer dielectric, as shown in FIG. 2b, which may accurately control the size of the channel to produce a lateral and vertical power MOSFET.

SUMMARY

In view of the foregoing, a primary object of the present disclosure is to provide a self-aligned silicon carbide MOSFET device with an optimized $P^+$ region and a method for manufacturing the same, so as to prevent the parasitic transistor effect of the parasitic NPN and PiN, to take both the turned on characteristics and the breakdown characteristics of the silicon carbide MOSFET device into consideration, and to optimize the manufacturing process of the device.

For this purpose, the present disclosure provides a self-aligned silicon carbide MOSFET device, wherein the self-aligned silicon carbide MOSFET device is formed by a plurality of silicon carbide MOSFET device cells connected in parallel, and these silicon carbide MOSFET device cells are arranged evenly.

In the above scheme, the silicon carbide MOSFET device cell comprises two source electrodes 1, one gate electrode 2, one gate oxide layer 3, two $N^+$ source regions 4, two $P^+$ contact regions 5, two P wells 6, one $N^-$ drift layer 7, one buffer layer 8, one $N^+$ substrate 9, one drain electrode 10 and one isolation dielectric layer 11, wherein the gate electrode 2 and the source electrode 1 are arranged on the same plane and located at an upper part of the device, and the drain electrode is located at a bottom of the device; the buffer layer 8 and the $N^-$ drift layer 7 are sequentially formed on the $N^+$ substrate 9; the two P wells 6 are respectively arranged on an upper part of a left and a right ends of the $N^-$ drift layer 7; one $N^+$ source region 4 and one $P^+$ contact region 5 are formed on each of the P wells 6, a depth of the $N^+$ source region 4 being less than a depth of the $P^+$ contact region 5; one source electrode 1 is formed on each of the P wells 6; the gate electrode 2 is arranged between the two source electrodes 1, and is isolated from the two source electrodes 1 by the isolation dielectric layer 11; the gate oxide layer 3 is formed under the gate electrode 2, and is arranged on the $N^-$ drift layer 7 and the two P wells 6; and the drain electrode 10 is formed on a bottom surface of the $N^+$ substrate 9.

In the above scheme, the $P^+$ contact region 5 includes a $P^+{}_1$ region, a $P^+{}_2$ region and a $P^+{}_2$ diffusion region, wherein both the $P^+{}_1$ region and the $P^+{}_2$ region are formed with heavy doping in an ion implantation way, doping concentration(s) of the $P^+{}_1$ region and the $P^+{}_2$ region being higher than that of the P well 6 in no less than an $1E19\ cm^{-3}$ order; and the $P^+{}_2$ diffusion region is formed in a diffusion way, which is diffused till a bottom of the P well or even lower than the bottom of the P well.

In the above scheme, Al ions, which have lower ion activation energy and are not prone to be diffused in high temperature activation annealing, are selected as ions doped in the $P^+{}_1$ region; and B ions, which are prone to be diffused in the high temperature activation annealing and have a deeper implantation depth, are selected as ions doped in the $P^+{}_2$ region.

In the above scheme, a temperature of the high temperature activation annealing is ranged between 1500° C. and 1900° C.

For this purpose, the present disclosure provides a method of manufacturing the silicon carbide MOSFET device, comprising: step 1 of cleaning a SiC wafer; step 2 of forming the P well on a surface of the SiC wafer; step 3 of forming a self-aligned channel in the P well; step 4 of forming the $P^+$ contact region at outside of the self-aligned channel; step 5 of high temperature activation annealing, so as to perform substitutional activation on the ions which are implanted into the $P^+$ contact region, the $N^+$ source region and the P well, and forming the $P^+_2$ diffusion region; step 6 of forming the gate oxide layer on a surface of the $N^-$ drift layer; step 7 of forming the gate electrode on the gate oxide layer; step 8 of forming the isolation dielectric layer at two sides of the gate electrode and on the surface of the gate electrode; and step 9 of forming the source electrodes at two sides of the isolation dielectric layer, and forming the drain electrode on the bottom surface of the $N^+$ substrate.

In the above scheme, the step 1 comprises: washing the surface of the SiC wafer with acetone, ethanol and deionized water sequentially, and drying the surface of the SiC wafer with $N_2$, the surface of the SiC wafer being dried for ten minutes in a $N_2$ atmosphere, wherein the SiC wafer has three layers from top to bottom, which are the $N^+$ substrate 9, the buffer layer 8 and the $N^-$ drift layer 7 subsequently.

In the above scheme, the step 2 comprises: depositing $SiO_2$ with a thickness of 2 μm and polysilicon (Poly-Si) with a thickness of 5000 μm subsequently on the $N^-$ drift layer 7 as mask layer material, and opening a window on the mask layer material by photolithography, the mask layer material on the two P wells 6 being etched and the mask layer material in other regions being remained; forming two P well implantation windows on the two P wells 6 and leaving the mask layer material between the two P wells 6 as a P well implantation mask layer; then performing an ion implantation of Al ions on the P wells from the two P well implantation windows at a high temperature of 500° C., the implantation energies of the ions being 300 kev, 410 kev, 500 kev respectively and a total dose thereof being 4.615E13 $cm^{-2}$.

In the above scheme, the step 3 comprises: depositing a $SiO_2$ layer with a thickness of 1 μm on the P well implantation mask layer and the ion-implanted P wells, performing full vertical etching on the $SiO_2$ layer using an ICP dry etching process and stopping the etching till the surfaces of the P wells are reached, the $SiO_2$ layer on the P well implantation mask layer and the $SiO_2$ layer on the P wells 6 being etched and the $SiO_2$ at two sides of the P well implantation mask layer being remained, and $SiO_2$ dielectric side walls at the two sides of the P well implantation mask layer between the two P wells 6 being formed, the $SiO_2$ dielectric side walls and the P well implantation mask layer between the two P wells 6 together being used as an $N^+$ source region 4 implantation mask layer; performing an ion implantation of a N ions on the $N^+$ source region 4 at a high temperature of 500° C., the implantation energies of the ions being 50 kev, 90 kev, 150 kev respectively and a total dose thereof being 9.84E13 $cm^{-2}$, so that the self-aligned channels are formed under the $SiO_2$ dielectric side walls within the two P wells by the above steps; and removing the $N^+$ source region 4 implantation mask layer after the implantation is completed.

In the above scheme, the step 4 comprises: depositing a $SiO_2$ layer with a thickness of 2 μm and a Poly-Si with a thickness of 5000 μm subsequently on the $N^-$ drift layer 7 for which the ion implantation on the P well 6 and the ion implantation on the $N^+$ source region 4 have been performed, as a mask layer; opening a window on the mask layer material by photolithography, the mask layer material on the two $P^+$ contact regions 5 being etched and the mask layer material in other regions being remained; forming two $P^+$ contact region implantation windows on the two $P^+$ contact regions 5 and leaving the mask layer material between the two $P^+$ contact regions 5 as a $P^+$ contact region implantation mask layer; then performing high temperature ion implantation from the two $P^+$ contact region implantation windows, wherein Al ions are implanted into the $P^+_1$ region at 500° C., the implantation energies of the ions being 50 kev, 90 kev, 150 kev respectively and a total dose thereof being 3.9E15 $cm^{-2}$; and B ions are implanted into the $P^+_2$ region at 500° C., the implantation energies of the ions being 160 kev, 270 kev respectively and a total dose thereof being 2.5E15 $cm^{-2}$, so that an implantation concentration of the $P^+$ region is up to 2E20 $cm^{-3}$, and removing the $P^+$ contact region 5 implantation mask layer after the implantation is completed.

In the above scheme, the step 5 comprises: performing RCA cleaning on the surface of the SiC wafer for which the ion implantation on the P well 6, the ion implantation on the $N^+$ source region 4 and the ion implantation on the $P^+$ contact region 5 have been implemented; performing carbon film protection on the surface of the SiC wafer after it is dried; performing activation annealing for 15 minutes in an Ar atmosphere at a temperature of 1750° C., so that the ions implanted into the $P^+$ contact region 5 including the $P^+_1$ region and the $P^+_2$ region, the $N^+$ source region 4, the P well 6 are subjected to the substitutional activation to have electrical characteristics, while the ions in the $P^+_2$ region are diffused to form the $P^+_2$ diffusion region; and removing the carbon film protection layer after the activation annealing is completed.

In the above scheme, the step 6 comprises: performing dry-oxidation at 1300° C. by an oxidation furnace on the surface of the $N^-$ drift layer 7 for which the high temperature activation annealing on the P well 6, the $N^+$ source region 4 and the $P^+$ contact region 5 has been performed, so as to form the gate oxide layer with a thickness of 60 nm; performing annealing at 1300° C. in the $N_2$ atmosphere and annealing at 1300° C. in a NO atmosphere to improve a quality of the gate oxide layer; then etching the gate oxide layer on the two source electrodes 1 by wet etching, with only the gate oxide layer right under the gate electrode 2 and within 0.5 μm from the gate electrode 2 between the gate electrode 2 and the source electrode 1 being remained.

In the above scheme, the step 7 comprises: depositing Poly-Si with a thickness of 5000 A on the SiC wafer on which the gate oxide layer 3 has been formed, and performing implantation doping and annealing activation; and performing dry-etching on the Poly-Si to remove the Poly-Si on the two $P^+$ contact regions 5 and on a part of the $N^+$ source region 4 and leave the Poly-Si on the gate oxide layer 3, so as to form a Poly-Si gate electrode 2, a width of the gate electrode 2 being less than a width of the gate oxide layer 3.

In the above scheme, the step 8 comprises: depositing $SiO_2$ with a thickness of 1.2 μm on the SiC wafer on which the gate electrode 2 has been formed, by using a LPCVD or PECVD method; and then etching the $SiO_2$ on the source electrode 1 to form a window shape for the required source electrode 1.

In the above scheme, the step 9 comprises: evaporating Ni with a thickness of 2000 A metal on the bottom surface of the $N^+$ substrate 9 as the drain electrode 10; spin-coating negative photoresist and performing photolithography and development on the SiC wafer on which the isolation dielectric layer 11 has been formed, removing the negative photoresist on the P+ contact region 5 and the part of the N+ source region 4, and leaving the negative photoresist on the gate oxide layer 3 as a source electrode 1 metallic ohmic contact region; then depositing Ni metal with a thickness of 800 A, lifting off the metal on the negative photoresist above the gate oxide layer 3 to leave the metal on the source electrode 1 metallic ohmic contact region without the negative photoresist as source electrode metal; and performing annealing on alloy at 970° C. for 2 minutes in the $N_2$ atmosphere to form the ohmic contact of the source electrode 1 and the drain electrode 10.

It can be seen from the above technical solutions that the present disclosure has beneficial effects as follows:

1. The self-aligned silicon carbide MOSFET device and the method for manufacturing the same provided by the present disclosure may prevent the NPN transistor from being avalanche breakdown by heavily doping the P+ region and shorting the source electrode and the P well, and also form the good source ohmic contact by heavily doping the P+ region, reducing the on-resistance to form a good conduction characteristics.

2. The self-aligned silicon carbide MOSFET device and the manufacturing method thereof provided by the present disclosure may heavily dope the P+ region till the bottom of the P well, preventing the parasitic PiN diode from being depleted on the P side which leads to breakdown of the PiN diode; and may also reduce the resistance of the P well to prevent the parasitic transistor from being switched on by mistake.

3. In the self-aligned silicon carbide MOSFET device and the manufacturing method thereof provided by the present disclosure, the heavily doped P+ region consists of three parts: the $P^+_1$ region, the $P^+_2$ region and the $P^+_2$ diffusion region, and is formed by a lower dose and energy implantation and diffusion, which may avoid effects of higher energy and higher dose on formation of the device, and significantly reduce the implantation cost and the implantation time.

4. The manufacturing method of the self-aligned silicon carbide MOSFET device is a novel self-aligned manufacturing method, which may simplify the process, control the size of the channel accurately, and may produce a lateral and vertical power MOSFET.

5. In the self-aligned silicon carbide MOSFET device and the manufacturing method thereof provided by the present disclosure, both the $P^+_1$ region and the $P^+_2$ region in the P+ contact region use the heavy doping, the doping contraction(s) thereof being higher than that of the P well region in no less than an 1E19 $cm^{-3}$ order.

6. In the self-aligned silicon carbide MOSFET device and the manufacturing method thereof provided by the present disclosure, the heavy doping of the $P^+_1$ region and the $P^+_2$ region is formed in the ion implantation; the ions (e.g., Al ions), which have the lower ion activation energy and are not prone to be diffused in the high temperature activation annealing, are selected for the $P^+_1$ region; the ions (e.g., B ions), which are prone to be diffused in the high temperature activation annealing and have the deeper implantation depth, are selected for the $P^+_2$ region; and the $P^+_2$ diffusion region is diffused till the bottom of the P well or even lower than the bottom of the P well.

7. The activation annealing temperature used in the self-aligned silicon carbide MOSFET device and the manufacturing method thereof provided by the present disclosure may enable a higher ion implantation activation on the $P^+_1$ region, and an easy diffusion of the ions on the $P^+_2$ region, the high temperature annealing temperature ranged between 1500° C. and 1900° C.

8. In the activation annealing temperature used in the self-aligned silicon carbide MOSFET device and the manufacturing method thereof provided by the present disclosure, the channels are formed by the self-aligning process, the P well implantation mask layer may be Poly-Si, a-Si, $SiO_2$, or other insulating layer dielectric; the N+ implantation mask layer is the P well implantation mask layer and the etched side walls of the insulating layer dielectric; the insulating layer dielectric is directly deposited on the P well implantation layer, anisotropic properties of the ICP dry-etching process being used to enable the width of the etched side to be equal to the length of the channel, as shown in FIG. 2b.

9. By optimizing the P+ region, the silicon carbide MOSFET device provided by the present disclosure, the self-aligned silicon carbide MOSFET device and the manufacturing method thereof provided by the present disclosure may form a good source ohmic contact, reduce the on-resistance, and also short the source electrode and the P well to prevent the parasitic transistor effect of the parasitic NPN and PiN, which may take both conduction characteristics and the breakdown characteristics of the device into consideration, and may be applied to a high voltage, high frequency silicon carbide MOSFET device. The self-aligning manufacturing method used in the present disclosure may simplify the process, control the size of the channel accurately, and may produce the lateral and vertical power MOSFET. The silicon carbide MOSFET device of the present disclosure may be used in a power-switch power supply circuit, DC/DC, AC/DC, DC/AC converters etc.

BRIEF DESCRIPTION OF THE DRAWINGS

In order to further illustrate the technical solutions of embodiments of the present disclosure, various embodiments of the present disclosure will be described in detail below with reference to the accompanying drawings. In the illustrated drawings.

FIGS. 3a to 3i are process flowcharts of manufacturing a self-aligned silicon carbide MOSFET device cell according to an embodiment of the present disclosure, in which FIG. 3a is a process schematic diagram of cleaning a silicon carbide wafer;

FIG. 3b is a process schematic diagram of forming a P well;

FIG. 3c is a process schematic diagram of forming a N+ source region and a self-aligned channel;

FIG. 3d is a process schematic diagram of forming a P+ contact region;

FIG. 3e is a process schematic diagram of high temperature activation annealing;

FIG. 3f is a process schematic diagram of forming a gate oxide layer;

FIG. 3g is a process schematic diagram of forming a gate electrode;

FIG. 3h is a process schematic diagram of forming an isolation dielectric layer; and FIG. 3i is a process schematic diagram of forming a drain electrode and a source electrode.

DETAILED DESCRIPTION

In order to clarify the object, technical solutions and advantages of the present disclosure better, embodiments of the present disclosure will be described in detail in connection with the drawings and the detailed description.

Figure 1A:
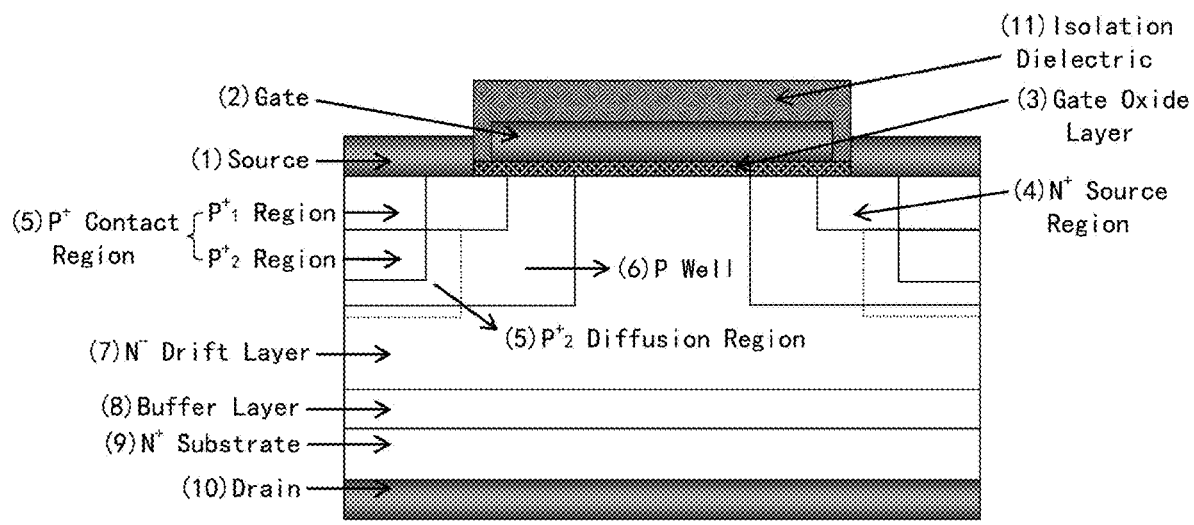
FIG. 1a is a structure schematic diagram of a single self-aligned silicon carbide MOSFET device cell according to an embodiment of the present disclosure.
Figure 1B:
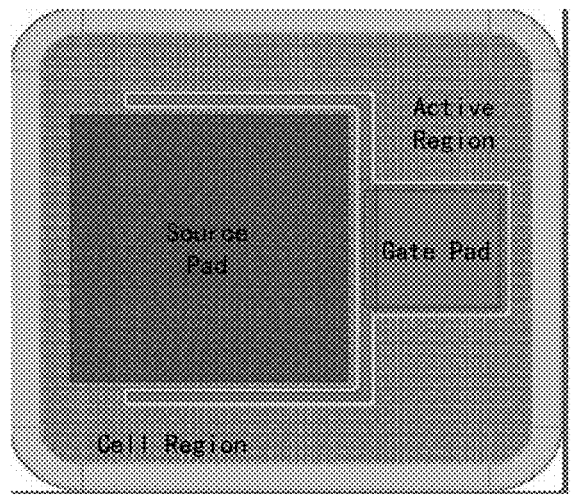
FIG. 1b is a layout for manufacturing a single self-aligned silicon carbide MOSFET device according to an embodiment of the present disclosure.
Figure 1C:
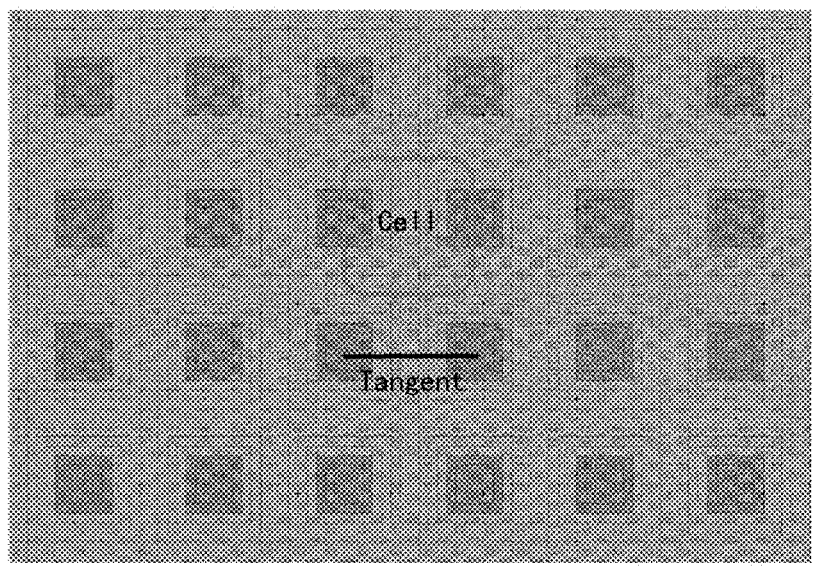
FIG. 1c is a schematic diagram of one active region in the layout of FIG. 1b, in which one cell is defined in a solid line block, and a cross-section view of the cell as shown in FIG. 1a may be obtained along a tangent, wherein an active region is also under a source electrode Pad in FIG. 1b, and the active region covers an area excluding a gate electrode Pad and a peripheral terminal.
Figure 2A:
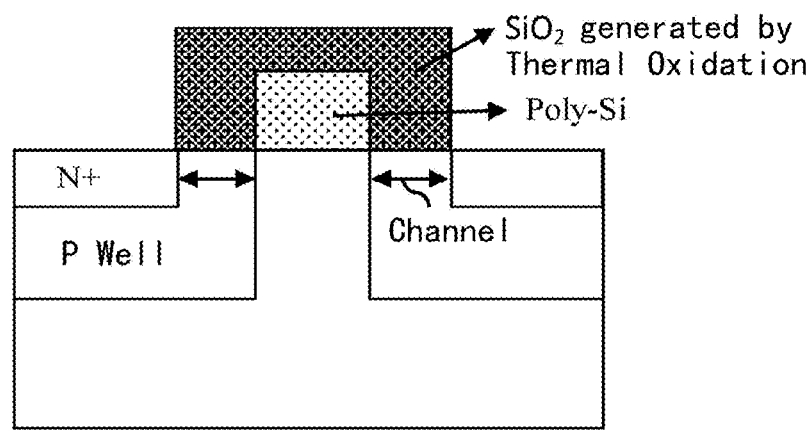
FIG. 2a is an illustration diagram of a conventional self-aligning process.
Figure 2B:
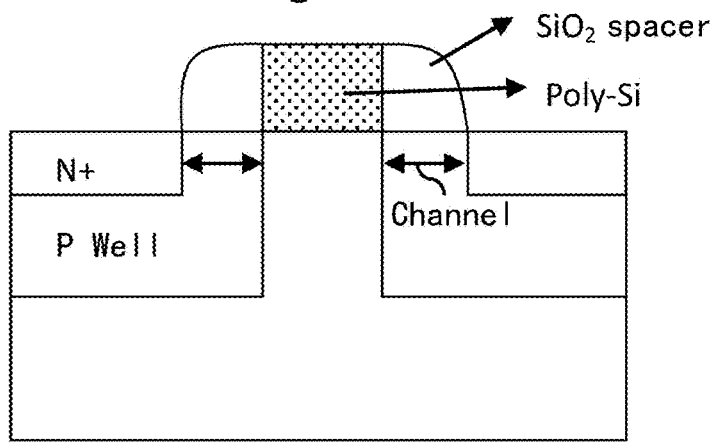
FIG. 2b is an illustration diagram of a self-aligning process according to an embodiment of the present disclosure.

The self-aligned silicon carbide MOSFET device provided by the present disclosure is formed by a plurality of silicon carbide MOSFET device cells connected in parallel, and these silicon carbide MOSFET device cells are arranged evenly. FIG. 1a shows a schematic block diagram of a single self-aligned silicon carbide MOSFET device cell according to an embodiment of the present disclosure, FIG. 1b is a layout for manufacturing a single self-aligned silicon carbide MOSFET device according to an embodiment of the present disclosure, FIG. 1c is a schematic diagram of one active region in the layout of FIG. 1b, in which one cell is defined in a solid line block, and a cross-section view of the cell as shown in FIG. 1a may be obtained along a tangent. The self-aligned silicon carbide MOSFET device cell in FIG. 1c is a square structure, but the self-aligned silicon carbide MOSFET device provided by the present disclosure is not limited to such as square structure.

With reference to FIG. 1, the single self-aligned silicon carbide MOSFET device cell according to the embodiment of the present disclosure comprises two source electrodes 1, one gate electrode 2, one gate oxide layer 3, two N+ source regions 4, two P+ contact regions 5, two P wells 6, one N− drift layer 7, one buffer layer 8, one N+ substrate 9, one drain electrode 10 and one isolation dielectric layer 11, wherein the gate electrode 2 and the source electrode 1 are arranged on the same plane and located at an upper part of the device, and the drain electrode is located at a bottom of the device; the buffer layer 8 and the N− drift layer 7 are sequentially formed on the N+ substrate 9; the two P wells 6 are respectively arranged on an upper part of a left and a right ends of the N− drift layer 7; one N+ source region 4 and one P+ contact region 5 are formed on each of the P wells 6, a depth of the N+ source region 4 being less than a depth of the P+ contact region 5; one source electrode 1 is formed on each of the P wells 6; the gate electrode 2 is arranged between the two source electrodes 1, and is isolated from the two source electrodes 1 by the isolation dielectric layer 11; and the gate oxide layer 3 is formed under the gate electrode 2, and is arranged on the N− drift layer 7 and the two P wells 6.

In a preferred embodiment, the P+ contact region 5 includes a $P^+_1$ region, a $P^+_2$ region and a $P^+_2$ diffusion region, wherein both the $P^+_1$ region and the $P^+_2$ region are formed with heavy doping in an ion implantation way, doping concentration(s) of the $P^+_1$ region and the $P^+_2$ region being higher than that of the P well 6 in no less than an 1E19 $cm^{-3}$ order; and the $P^+_2$ diffusion region is formed in a diffusion way, which is diffused till a bottom of the P well or even lower than the bottom of the P well.

In a preferred embodiment, Al ions, which have lower ion activation energy and are not prone to be diffused in high temperature activation annealing, are selected as ions doped in the $P^+_1$ region; and B ions, which are prone to be diffused in the high temperature activation annealing and have a deeper implantation depth, are selected as ions doped in the $P^+_2$ region. A temperature of the high temperature activation annealing is ranged between 1500° C. and 1900° C.

Based on the structure schematic diagram of the single self-aligned silicon carbide MOSFET device cell according to an embodiment of the present disclosure as shown in FIGS. 1a to 1c, FIGS. 3a to 3i show process flowcharts of manufacturing a self-aligned silicon carbide MOSFET device cell according to an embodiment of the present disclosure, which particularly comprises the following steps:

Step 1 of cleaning a SiC wafer.

Figure 3A:
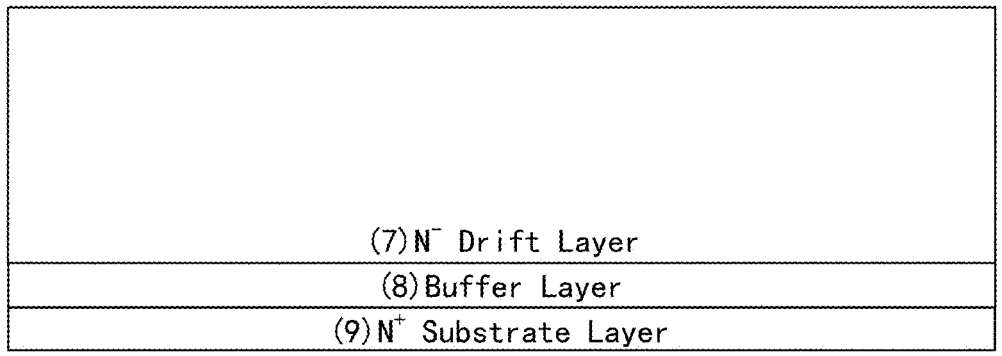

In such as step as shown in FIG. 3a, the surface of the SiC wafer is washed with acetone, ethanol and deionized water sequentially, and the surface of the SiC wafer is dried with $N_2$, the surface of the SiC wafer being dried for ten minutes in a $N_2$ atmosphere, wherein the SiC wafer has three layers from top to bottom, which are the N+ substrate 9, the buffer layer 8 and the N− drift layer 7 subsequently.

Figure 3B:
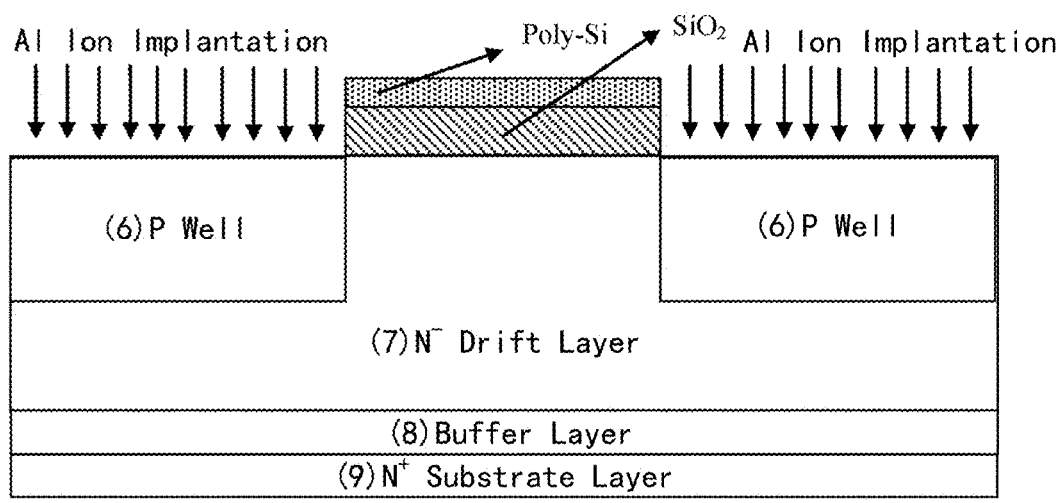

Step 2 of forming the P well on a surface of the SiC wafer.

in which, as shown in FIG. 3b, $SiO_2$ with a thickness of 2 μm and polysilicon (Poly-Si) with a thickness of 5000 μm are deposited subsequently on the N− drift layer 7 as mask layer material, and a window is opened on the mask layer material by photolithography, the mask layer material on the two P wells 6 being etched and the mask layer material in other regions being remained; two P well implantation windows are formed on the two P wells 6 and the mask layer material between the two P wells 6 is remained as a P well implantation mask layer; then an ion implantation of Al ion at a high temperature of 500° C. is performed on the P wells from the two P well implantation windows, the implantation energies of the ions being 300 kev, 410 kev, 500 kev respectively and a total dose thereof being 4.615E13 $cm^{-2}$.

Step 3 of forming a self-aligned channel in the P well.

Figure 3C:
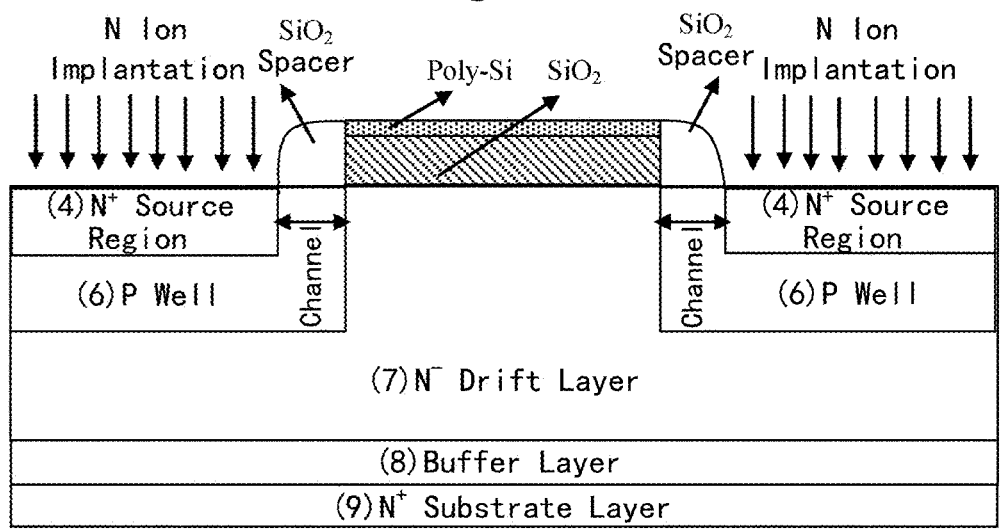

In such a step, as shown in FIG. 3c, a $SiO_2$ layer with a thickness of 1 μm is deposited on the P well implantation mask layer and the ion-implanted P wells, full vertical etching is performed on the $SiO_2$ layer using an ICP dry etching process and the etching is stopped till the surfaces of the P wells are reached, the $SiO_2$ layer on the P well implantation mask layer and the $SiO_2$ layer on the P wells 6 being etched and the $SiO_2$ at two sides of the P well implantation mask layer being remained, and $SiO_2$ dielectric side walls at the two sides of the P well implantation mask layer between the two P wells 6 being formed, the $SiO_2$ dielectric side walls and the P well implantation mask layer between the two P wells 6 together being used as an N+ source region 4 implantation mask layer; an ion implantation of N ions is performed on the N+ source region 4 at a high temperature of 500° C., implantation energies of the ions being 50 kev, 90 kev, 150 kev respectively and a total dose thereof being 9.84E13 $cm^{-2}$, so that the self-aligned channels are formed under the $SiO_2$ dielectric side walls within the two P wells by the above steps; and removing the N+ source region 4 implantation mask layer after the implantation is completed.

Figure 3D:
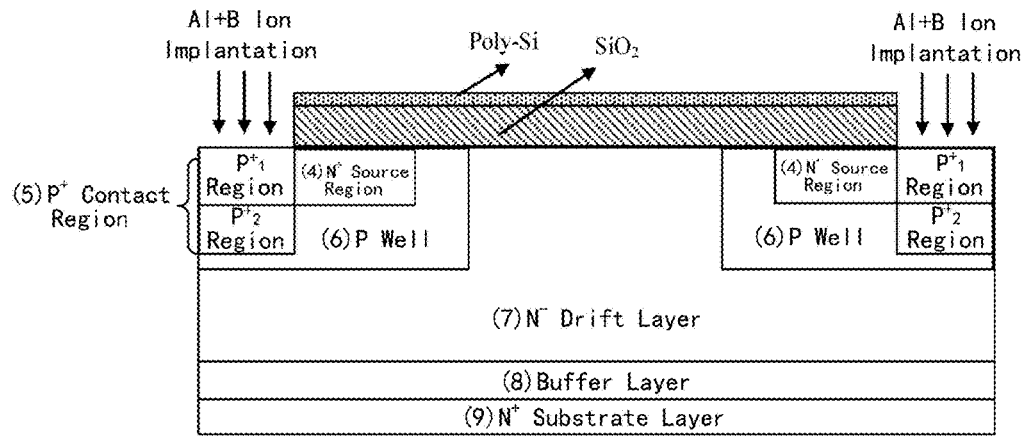

Step 4 of forming the P+ contact region out of the self-aligned channel;

in which, as shown in FIG. 3d, a $SiO_2$ layer with a thickness of 2 μm and a Poly-Si with a thickness of 5000 μm are deposited subsequently on the N− drift layer 7 for which the ion implantation on the P well 6 and the ion implantation on the N⁺ source region 4 have been performed, as a mask layer; the window is photoetched on the mask layer material, the mask layer material on the two P⁺ contact regions 5 being etched and the mask layer material in other regions being remained; two P⁺ contact region implantation windows are formed on the two P⁺ contact regions 5 and the mask layer material between the two P⁺ contact regions 5 is remained as a P⁺ contact region implantation mask layer; then high temperature ion implantation is performed from the two P⁺ contact region implantation windows, wherein Al ions are implanted into the $P^+_1$ region at 500° C., the implantation energies of the ions being 50 kev, 90 kev, 150 kev respectively and a total dose thereof being 3.9E15 $cm^{-2}$; and B ions are implanted into the $P^+_2$ region at 500° C., the implantation energies of the ions being 160 kev, 270 kev respectively and a total dose thereof being 2.5E15 $cm^{-2}$, so that an implantation concentration of the P⁺ region is up to 2E20 $cm^{-3}$; and the implantation mask layer for the P⁺ contact region 5 is removed after the implantation is completed.

Step 5 of high temperature activation annealing, so as to perform substitutional activation on the ions which are implanted into the P⁺ contact region, the N⁺ source region and the P well, and form the $P^+_2$ diffusion region.

Figure 3E:
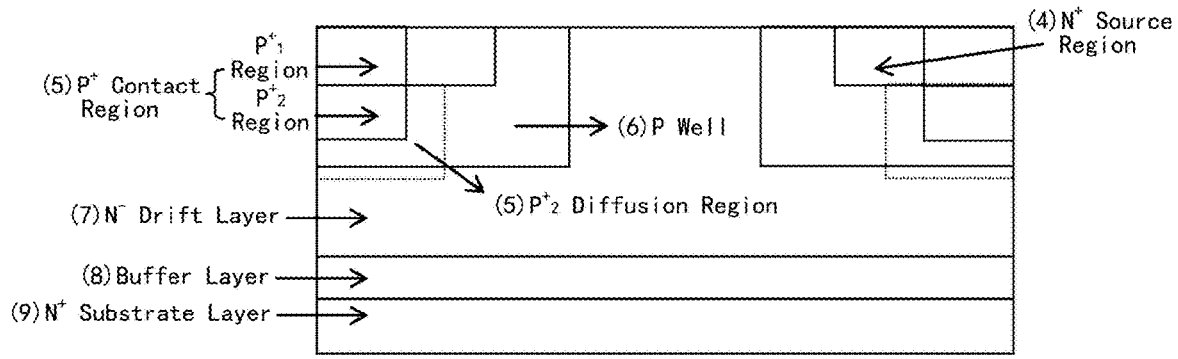

In such a step as shown in FIG. 3e, RCA cleaning is performed on the surface of the SiC wafer for which the ion implantation on the P well 6, the ion implantation on the N⁺ source region 4 and the ion implantation on the P⁺ contact region 5 have been formed; a carbon film protection is performed on the surface of the SiC wafer after it is dried; an activation annealing is performed for 15 minutes in an Ar atmosphere at a temperature of 1750° C., so that the ions implanted into the P⁺ contact region 5 including the $P^+_1$ region and the $P^+_2$ region, the N⁺ source region 4, the P well 6 are subjected to the substitutional activation to have electrical characteristics, while the ions in the $P^+_2$ region are diffused to form the $P^+_2$ diffusion region; and the carbon film protection layer is removed after the activation annealing is completed.

Step 6 of forming the gate oxide layer on a surface of the N⁻ drift layer.

Figure 3F:
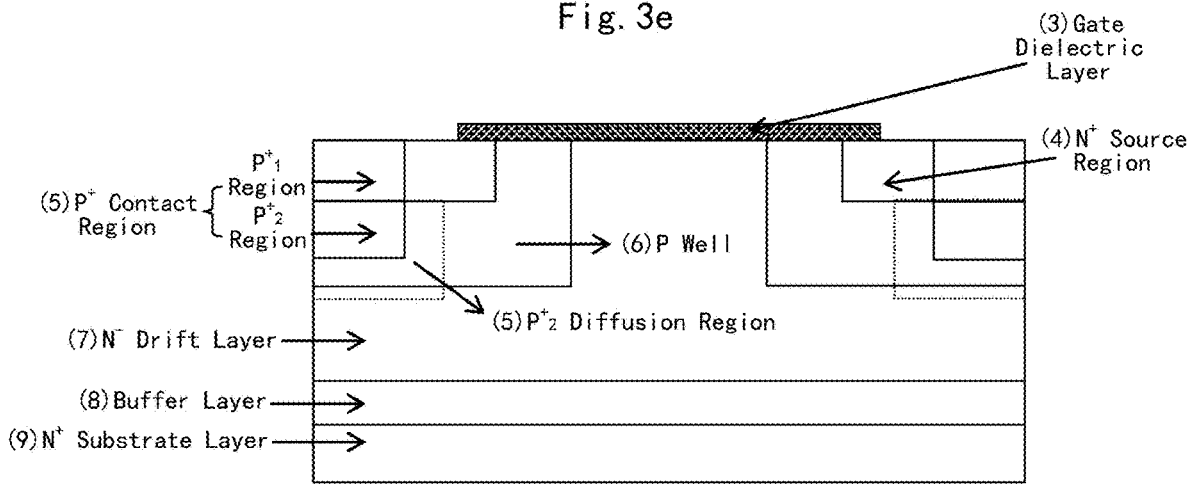

In such a step as shown in FIG. 3f, dry-oxidation at 1300° C. is performed by an oxidation furnace on the surface of the N⁻ drift layer 7 for which the high temperature activation annealing on the P well 6, the N⁺ source region 4 and the P⁺ contact region 5 has been performed, so as to form the gate oxide layer with a thickness of 60 nm; annealing at 1300° C. in the $N_2$ atmosphere and annealing at 1300° C. in a NO atmosphere are performed to improve a quality of the gate oxide layer; then etching the gate oxide layer on the two source electrodes 1 by wet etching, with only the gate oxide layer right under the gate electrode 2 and within 0.5 µm away from the gate electrode 2 between the gate electrode 2 and the source electrode 1 being remained.

Step 7 of forming the gate electrode on the gate oxide layer.

Figure 3G:
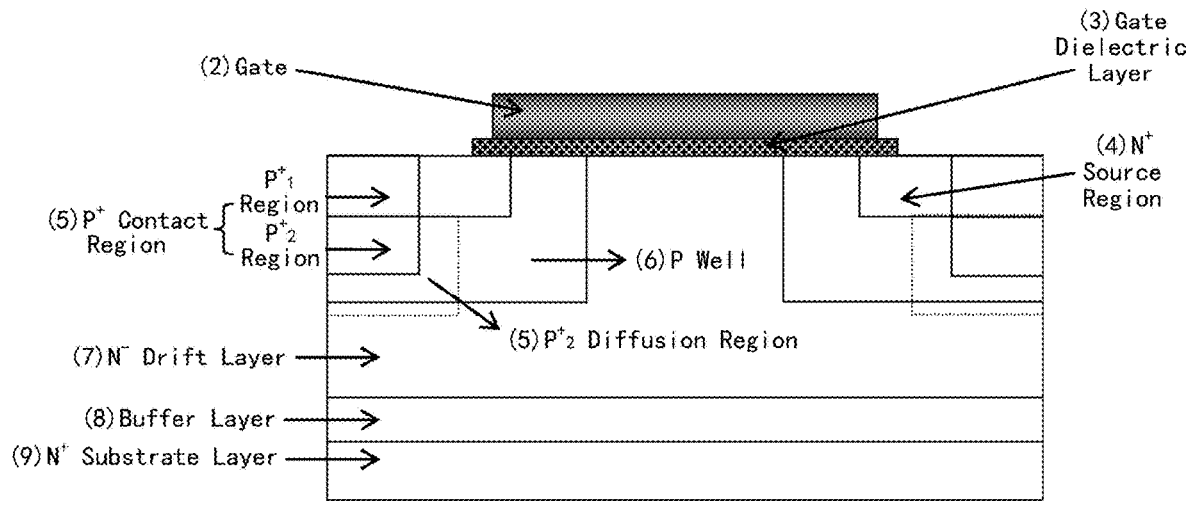

In such a step as shown in FIG. 3g, Poly-Si with a thickness of 5000 A is deposited on the SiC wafer on which the gate oxide layer 3 has been formed, and implantation doping and annealing activation are performed; and dry-etching is performed on the Poly-Si to remove the Poly-Si on the two P⁺ contact regions 5 and on a part of the N⁺ source region 4 and leave the Poly-Si on the gate oxide layer 3, so as to form a Poly-Si gate electrode 2, a width of the gate electrode 2 being less than a width of the gate oxide layer 3.

Step 8 of forming the isolation dielectric layer at two sides of the gate electrode and on the surface of the gate electrode.

Figure 3H:
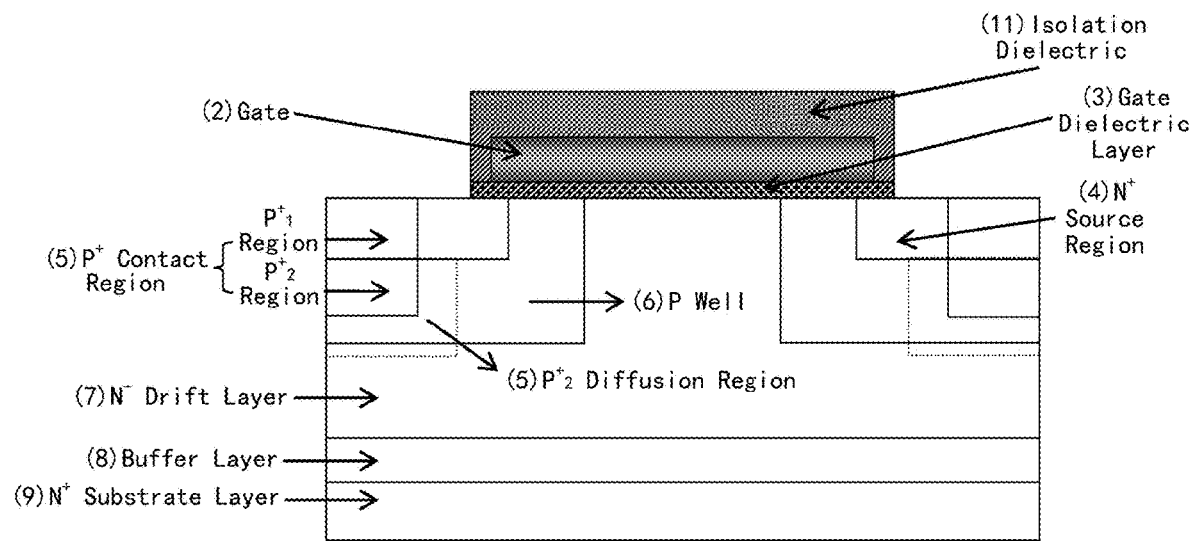

In such a step as shown in FIG. 3h, $SiO_2$ with a thickness of 1.2 µm is deposited on the SiC wafer on which the gate electrode (2) has been formed, by using a LPCVD or PECVD method; and then the $SiO_2$ on the source electrode 1 is etched out to form a window shape for the required source electrode 1.

Step 9 of forming the source electrodes at two sides of the isolation dielectric layer, and forming the drain electrode on the bottom surface of the N⁺ substrate.

Figure 3I:
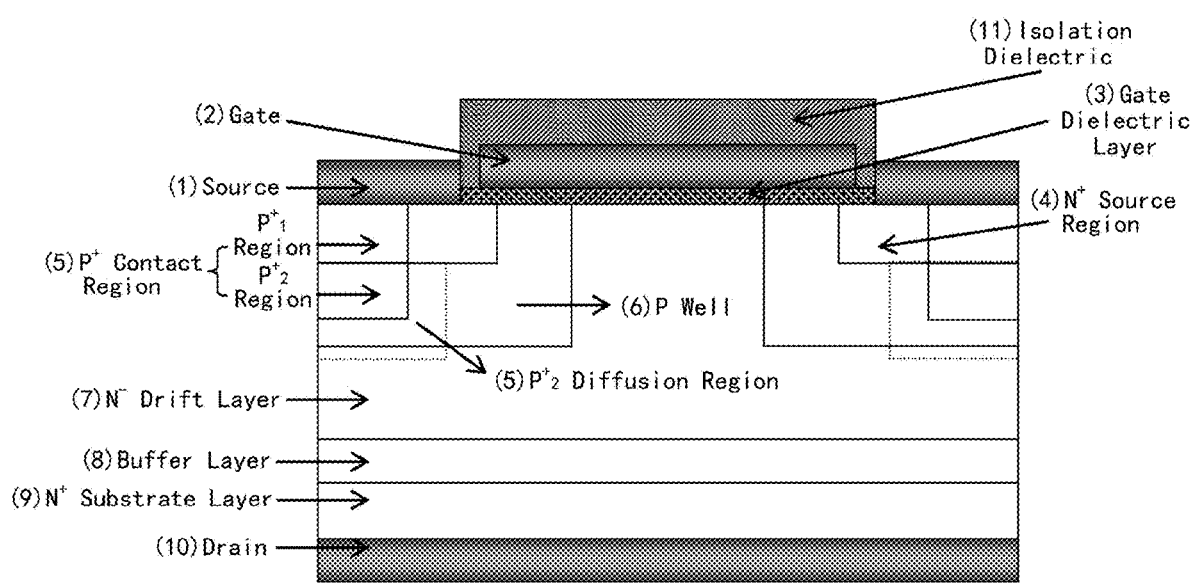

In such a step as shown in FIG. 3i, Ni metal with a thickness of 2000 A is evaporated on the bottom surface of the N⁺ substrate 9 as the drain electrode 10; on the SiC wafer on which the isolation dielectric layer 11 has been formed, negative photoresist is spin-coated and photolithography and development are performed, the negative photoresist on the P⁺ contact region 5 and the part of the N⁺ source region 4 is removed, and the negative photoresist on the gate oxide layer 3 is remained as a source electrode 1 metallic ohmic contact region; then Ni metal with a thickness of 800 A is deposited, the metal on the negative photoresist on the gate oxide layer 3 is peeled off to keep the metal on the source electrode 1 metallic ohmic contact region without the negative photoresist as source electrode metal; and annealing is performed on alloy at 970° C. for 2 minutes in the $N_2$ atmosphere to form the ohmic contact of the source electrode 1 and the drain electrode 10.

Finally, the manufacture of one silicon carbide MOSFET device cell is completed.

In practical applications, the silicon carbide MOSFET device is consisted of many identical cells, and the above manufacturing process may form a plurality of cells simultaneously. The manufacturing process may be spread to the production process of the whole device which thus will not be described here for simplicity.

It may be understood that the above implementations are only exemplary implementations for illustrating the principles of the present disclosure, but the present disclosure is not limited to these. For the skilled in the art, various variations and improvements may be made without being apart from the sprit and substance of the present disclosure, which also fall into the protection scope of the present disclosure.

We claim:

1. A self-aligned silicon carbide MOSFET device, wherein the self-aligned silicon carbide MOSFET device is formed by a plurality of silicon carbide MOSFET device cells connected in parallel, and these silicon carbide MOSFET device cells are arranged evenly, wherein the silicon carbide MOSFET device cell comprises two source electrodes, one gate electrode, one gate oxide layer, two N⁺ source regions, two P⁺ contact regions, two P wells, one N⁻ drift layer, one buffer layer, one N⁺ substrate, one drain electrode and one isolation dielectric layer, wherein the gate electrode and the source electrode are arranged on the same plane and located at an upper part of the device, and the drain electrode is located at a bottom of the device;

the buffer layer and the N⁻ drift layer are sequentially formed on the N⁺ substrate;

the two P wells are respectively arranged on an upper part of a left and a right ends of the N⁻ drift layer;

one N⁺ source region and one P⁺ contact region are formed on each of the P wells, a depth of the N⁺ source region being less than that of the P⁺ contact region;

one source electrode is formed on each of the P wells;

the gate electrode is arranged between the two source electrodes, and is isolated from the two source electrodes by the isolation dielectric layer;

the gate oxide layer is formed under the gate electrode, and is arranged on the $N^-$ drift layer and the two P wells; and the drain electrode is formed on a bottom surface of the $N^+$ substrate, wherein the $P^+$ contact region includes a $P^+_1$ region, a $P^+_2$ region and a $P^+_2$ diffusion region, wherein both of the $P^+_1$ region and the $P^+_2$ region are formed with a heavy doping in an ion implantation way, the doping concentration(s) of the $P^+_1$ region and the $P^+_2$ region being higher than that of the P well in no less than an IE19 $cm^{-3}$ order; and the $P^+_2$ diffusion region is formed in a diffusion way, which is diffused till a bottom of the P well or even lower than the bottom of the P well, wherein Al ions, which have a lower ion activation energy and are not prone to be diffused in a high temperature activation annealing process, are selected as ions doped in the $P^+_1$ region; and B ions, which are prone to be diffused in the high temperature activation annealing process and have a deeper implantation depth, are selected as ions doped in the $P^+_2$ region, wherein a temperature of the high temperature activation annealing is ranged between 1500° C. and 1900° C.

2. A method of manufacturing the silicon carbide MOSFET device according to claim 1, wherein the method comprising:

cleaning a SiC wafer;

forming the P well on a surface of the SiC wafer;

forming a self-aligned channel in the P well;

forming the P+ contact region at outside of the self-aligned channel;

high temperature activation annealing, so as to perform substitutional activation on the ions which are implanted into the P+ contact region, the N+ source region and the P well, and forming the P+2 diffusion region;

forming the gate oxide layer on a surface of the N-drift layer;

forming the gate electrode on the gate oxide layer;

forming the isolation dielectric layer at two sides of the gate electrode and on the surface of the gate electrode; and forming the source electrodes at two sides of the isolation dielectric layer, and forming the drain electrode on the bottom surface of the N+ substrate.

3. The method of manufacturing the silicon carbide MOSFET device according to claim 2, wherein the step of cleaning a SiC wafer comprises:

washing the surface of the SiC wafer with acetone, ethanol and deionized water sequentially, and drying the surface of the SiC wafer with $N_2$, the surface of the SiC wafer being dried for ten minutes in a $N_2$ atmosphere, wherein the SiC wafer has three layers from top to bottom, which are the N+ substrate, the buffer layer and the N- drift layer subsequently.

4. The method of manufacturing the silicon carbide MOSFET device according to claim 3, wherein the step of forming the P well on a surface of the SiC wafer comprises:

depositing $SiO_2$ with a thickness of 2 μm and polysilicon (Poly-Si) with a thickness of 5000 μm subsequently on the N- drift layer as mask layer material, and opening a window on the mask layer material by photolithography, the mask layer material on the two P wells being etched and the mask layer material in other regions being remained;

forming two P well implantation windows on the two P wells and leaving the mask layer material between the two P wells as a P well implantation mask layer; and performing an ion implantation of Al ions on the P wells from the two P well implantation windows at a high temperature of 500° C., the implantation energies of the ions being 300 kev, 410 kev, 500 kev respectively and a total dose thereof being 4.615E13 cm-2.

5. The method of manufacturing the silicon carbide MOSFET device according to claim 4, wherein the step of forming a self-aligned channel in the P well comprises:

depositing a $SiO_2$ layer with a thickness of 1 μm on the P well implantation mask layer and the ion-implanted P wells, performing full vertical etching on the $SiO_2$ layer using an ICP dry etching process and stopping the etching till the surfaces of the P wells are reached, the $SiO_2$ layer on the P well implantation mask layer and the $SiO_2$ layer on the P wells being etched and the $SiO_2$ at two sides of the P well implantation mask layer being remained, and $SiO_2$ dielectric side walls at the two sides of the P well implantation mask layer between the two P wells being formed, the $SiO_2$ dielectric side walls and the P well implantation mask layer between the two P wells together being used as an N+ source region mask layer;

performing an ion implantation of Nitrogen ions on the N+ source region at a high temperature of 500° C., the implantation energies of the ions being 50 kev, 90 kev, 150 kev respectively and a total dose thereof being 9.84E13 cm-2, so that the self-aligned channels are formed under the $SiO_2$ dielectric side walls within the two P wells; and removing the N+ source region implantation mask layer after the implantation is completed.

6. The method of manufacturing the silicon carbide MOSFET device according to claim 5, wherein the step of forming the P+ contact region at outside of the self-aligned channel comprises:

depositing a $SiO_2$ layer with a thickness of 2 μm and a Poly-Si with a thickness of 5000 μm subsequently on the N- drift layer for which the ion implantation on the P well and the ion implantation on the N+ source region have been performed, as a mask layer;

opening a window on the mask layer material by photolithography, the mask layer material on the two P+ contact regions being etched and the mask layer material in other regions being remained;

forming two P+ contact region implantation windows on the two P+ contact regions and leaving the mask layer material between the two P+ contact regions as a P+ contact region implantation mask layer;

performing high temperature ion implantation from the two P+ contact region implantation windows, wherein Al ions are implanted into the $P^+1$ region at 500° C., implantation energies of the ions being 50 kev, 90 kev, 150 kev respectively and a total dose thereof being 3.9E15 cm-2, and B ions are implanted into the $P^+2$ region at 500° C., implantation energies of the ions being 160 kev, 270 kev respectively and a total dose thereof being 2.5E15 cm-2, so that an implantation concentration of the P+ region is up to 2E20 cm-3; and removing the P+ contact region implantation mask layer after the implantation is completed.

7. The method of manufacturing the silicon carbide MOSFET device according to claim 6, wherein the step of high temperature activation annealing comprises:
performing RCA cleaning on the surface of the SiC wafer for which the ion implantation on the P well, the ion implantation on the N+ source region and the ion implantation on the P+ contact region have been implemented;
performing carbon film protection on the surface of the SiC wafer after it is dried;
performing activation annealing for 15 minutes in an Ar atmosphere at a temperature of 1750° C., so that the ions implanted into the P+ contact region including the $P^+1$ region and the $P^+2$ region, the N+ source region, the P well are subjected to the substitutional activation to have electrical characteristics, while the ions in the $P^+2$ region are diffused to form the $P^+$ 2 diffusion region; and
removing the carbon film protection layer after the activation annealing is completed.

8. The method of manufacturing the silicon carbide MOSFET device according to claim 7, wherein the step of forming the gate oxide layer on a surface of the N-drift layer comprises:
performing dry oxidation at 1300° C. by an oxidation furnace on the surface of the N− drift layer for which the high temperature activation annealing on the P well, the N+ source region and the P+ contact region has been performed, so as to form the gate oxide layer with a thickness of 60 nm;
performing annealing at 1300° C. in the $N_2$ atmosphere and annealing at 1300° C. in a NO atmosphere to improve a quality of the gate oxide layer; and
etching the gate oxide layer on the two source electrodes by wet etching, with only the gate oxide layer right under the gate electrode and within 0.5 pm away from the gate electrode between the gate electrode and the source electrode being remained.

9. The method of manufacturing the silicon carbide MOSFET device according to claim 8, wherein the step of forming the gate electrode on the gate oxide layer comprises:
depositing Poly-Si with a thickness of 5000 Å on the SiC wafer on which the gate oxide layer has been formed, and performing implantation doping and annealing activation; and
performing dry-etching on the Poly-Si to remove the Poly-Si on the two P+ contact regions and on a part of the N+ source region and leave the Poly-Si on the gate oxide layer, so as to form a Poly-Si gate electrode, a width of the gate electrode being less than a width of the gate oxide layer.

10. The method of manufacturing the silicon carbide MOSFET device according to claim 9, wherein the step of forming the isolation dielectric layer at two sides of the gate electrode comprises:
depositing $SiO_2$ with a thickness of 1.2 μm on the SiC wafer on which the gate electrode has been formed, by using a LPCVD or PECVD method; and then etching the $SiO_2$ on the source electrode to form a window shape for the required source electrode.

11. The method of manufacturing the silicon carbide MOSFET device according to claim 10, wherein the step of forming the source electrodes and the drain electrode comprises:
evaporating Ni metal with a thickness of 2000 Å on the bottom surface of the N+ substrate as the drain electrode.

* * * * *